(12) United States Patent
Ikeda

(10) Patent No.: US 7,147,480 B2
(45) Date of Patent: Dec. 12, 2006

(54) CONNECTING STRUCTURE OF FLEXIBLE PRINTED CIRCUIT BOARD TO PRINTED CIRCUIT BOARD

(75) Inventor: Aiichiro Ikeda, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 0 days.

(21) Appl. No.: 11/113,281

(22) Filed: Apr. 25, 2005

(65) Prior Publication Data

US 2006/0025023 A1 Feb. 2, 2006

(30) Foreign Application Priority Data

Apr. 28, 2004 (JP) ............... 2004-132701

(51) Int. Cl.
*H01R 12/00* (2006.01)
(52) U.S. Cl. ...................................... 439/67
(58) Field of Classification Search ................. 439/67, 439/68, 70; 361/349, 749; 174/254, 88 R, 174/260

See application file for complete search history.

(56) References Cited

U.S. PATENT DOCUMENTS

| | | | | |
|---|---|---|---|---|
| 4,109,298 | A | * | 8/1978 | Hanni et al. ............... 361/803 |
| 4,495,546 | A | * | 1/1985 | Nakamura et al. .......... 361/749 |
| 5,754,411 | A | * | 5/1998 | Woychik .................... 361/803 |

FOREIGN PATENT DOCUMENTS

| | | |
|---|---|---|
| JP | 61-114877 | 7/1986 |
| JP | 2002-270978 | 9/2002 |
| JP | 2002-270979 | 9/2002 |

\* cited by examiner

*Primary Examiner*—Phuong Dinh
(74) *Attorney, Agent, or Firm*—Bacon & Thomas, PLLC

(57) ABSTRACT

The present invention provides a simple structure for connecting a flexible printed circuit board to a printed circuit board in which when connecting a flexible printed circuit board to a printed circuit board, the positioning thereof can be made easily, the connection therebetween can be made smoothly and rigidly, and further the assembling time can be reduced. Patterns, on a flexible printed circuit board and a printed circuit board are aligned and connected with each other by soldering. An elongate hole is formed in the vicinity of and along the edge portion in a connecting part of the printed circuit board, and two rectangular holes communicating with the elongate hole are formed at both longitudinal ends of the elongate hole, while two notches for controlling insertion depth are provided at opposing ends of the connecting edge of the flexible printed circuit board. The leading edge portion of the flexible printed circuit board, which is left between the cut portions, is bent downward, and the bent portion is inserted into the elongate hole and the rectangular holes of the printed circuit board to position the flexible printed circuit board, and then the patterns, respectively located on the flexible printed circuit board and the printed circuit board, are connected by soldering.

9 Claims, 4 Drawing Sheets

CONNECTING STRUCTURE OF FLEXIBLE PRINTED CIRCUIT BOARD TO PRINTED CIRCUIT BOARD

CROSS-REFERENCE TO RELATED APPLICATIONS

This application claims priority, under 35 USC 119, of Japanese Application No. 2004-132,701, filed Apr. 28, 2005, the teachings of which are incorporated herein in their entirety.

BACKGROUND OF THE INVENTION

1. Field of the Invention

The present invention relates to a connecting structure for connecting a flexible printed circuit board to another printed circuit board, in which patterns are aligned to allow the printed circuit boards to be connected by soldering.

2. Description of the Prior Art

In one conventional connecting structure patterns 104 on a flexible printed circuit board 103 are aligned with patterns 102 on a printed circuit board 101 and the patterns 102 and 104 are connected by soldering 105, as shown in FIG. 3. However, the patterns 104 on the flexible printed circuit board 103 are manually aligned with the patterns 102 on the printed circuit board 101, resulting in a problem in that hand movement, etc. can make the positioning and therefore the connection between the patterns 102 and 104 by the soldering 105 difficult.

In FIG. 4 is shown a first prior art connecting structure for flexible circuit boards in which a plurality of longitudinal slits 212 are provided in one end portion of a flexible circuit board 210 to form portions 213 outboard of the slits 212 which are bent and are inserted into engaging holes 211d formed in a rigid circuit board 211 to position conductor patterns 210b on the flexible circuit board 210 against conductor patterns 211b on the rigid circuit board 211 (refer to Japanese Utility-Model Laid-Open Publication No. Sho 61-114877 for example).

However, the above connecting structure suffers from a problem in that when the flexible circuit board 210 is lifted upward, the bent portions 213 can easily be removed from the engaging holes 211d.

FIGS. 5 (a) and 5 (b) show a second prior art structure for connecting conductive members which includes an engaging hole 303 in a circuit board 301. One end of a flexible circuit board 302 is divided into three portions by making two slits 305, and the central portion 306c is bent downward, with first and second engaging portions 306a and 306b positioned on the upside surface of the circuit board 301. The third (central) engaging portion 306c is bent to be positioned on the underside surface of the circuit board 301, i.e. the third engaging portion 306c is passed under the circuit board 301 through the engaging hole 303 so that the flexible circuit board 302 is fixed to the circuit board 301 in a sandwiched manner, and connecting parts 307 at the end portion of the flexible circuit board 302 are connected to electrode patterns 304 on the circuit board 301 by soldering 308 (refer to Japanese Patent Laid-Open Publication No. 2002-270978 for example).

However, the arrangement described above suffers from a problem in that part of the electrode patterns 304 must be formed on the underside surface of the circuit board 301, that is, the circuit board 301 must be double-sided.

FIGS. 6 (a) and 6 (b) show a third prior art connecting structure which includes an engaging hole 403 in a circuit board 401. The vicinity of one end portion of a flexible circuit board 402 is bent perpendicularly to the extended direction over the entire width to provide a convexly projecting engaging portion 405. The engaging portion 405, which has a height greater than the thickness of the circuit board 401, comprises a projecting portion 406a having a width equal to or smaller than the lateral width of the engaging hole 403 and a lock portion 406b formed on the top of the projecting portion 406a and having a width greater than the lateral width of the engaging hole 403. Thus, once the engaging portion 405 is fitted into the engaging hole 403, the lock portion 406b is caught on the edge of the engaging hole 403 so that the flexible circuit board 402 is fixed to the circuit board 401. Then, connecting parts 407 in the end portion of the flexible circuit board 402 are connected to electrode patterns 404 on the circuit board 401 by soldering 408 (refer to Japanese Patent Laid-Open Publication No. 2002-270979 for example).

However, the arrangement above suffers from a problem in that the engaging portion 405 should be formed projecting downward from the flexible circuit board 402, which complicates the shape of the flexible circuit board 402.

SUMMARY OF THE INVENTION

The present invention has been made in consideration of the above-described problems, and an object thereof is to provide a simple connecting structure for connecting a flexible printed circuit board to another printed circuit board, which structure provides ease in positioning so that the connection therebetween can be made smoothly and rigidly, and further the assembling time can be reduced.

The present invention solves the above-described problems by providing a connecting structure in which patterns on a flexible printed circuit board are aligned with patterns on a printed circuit board to connect the flexible printed circuit board and the printed circuit board by soldering. The connecting structure includes an elongate hole formed in the vicinity of and along an edge portion in a connecting part of the printed circuit board, and rectangular holes communicating with the elongate hole are formed at in both longitudinal end portions of the elongate hole, while cut portions for controlling insertion depth are provided on both ends of the connecting edge of the flexible printed circuit board, a leading edge portion of the flexible printed circuit board, which is left between the cut portions, being bent downward, and that the bent portion is inserted into the elongate hole and the rectangular holes of the printed circuit board to position the flexible printed circuit board, and then patterns on the flexible printed circuit board and patterns on the printed circuit board, which face each other, are connected by soldering.

In its broadest aspect the present invention provides a connecting structure in which a flexible printed circuit board to a printed circuit board in which patterns on a flexible printed circuit board are aligned to patterns on a printed circuit board to connect the flexible printed circuit board and the printed circuit board by soldering, characterized in that an elongate hole is formed in the vicinity of and along an edge portion in a connecting part of the printed circuit board, and cut portions for controlling insertion depth are provided on both ends of the connecting edge of the flexible printed circuit board, the leading edge portion of the flexible printed circuit board, which is left between the cut portions, being bent downward, and that the bent portion is inserted into the elongate hole of the printed circuit board to position the flexible printed circuit board, and then patterns on the flexible printed circuit board and patterns on the printed circuit board, which face each other, are connected by soldering.

In one preferred emboidment rectangular holes communicating with the elongate hole are formed at both longitudinal ends of the elongate hole of the printed circuit board, the leading edge portion of the flexible printed circuit board, which is left between the cut portions, being inserted into the elongate hole and the rectangular holes of the printed circuit board.

Tapered cut portions which narrow toward the connecting edge may be provided on both ends of the leading edge portion of the flexible printed circuit board, which is left between the cut portions.

In the first embodiment, the leading edge portion of the flexible printed circuit board, which is left between the cut portions, is bent downward to be inserted into the elongate hole and the rectangular holes of the printed circuit board, which allows the flexible printed circuit board to be easily positioned against the other printed circuit board. It is also possible to connect the boards smoothly and rigidly with such a simple structure, and further to reduce the assembling time. In particular, the leading edge portion of the flexible printed circuit board, which is left between the cut portions and inserted into the elongate hole and the rectangular holes of the printed circuit board, is curved, which allows the leading edge portion to be held and connected rigidly.

Preferably, the leading edge portion of the flexible printed circuit board, which is left between the cut portions, is bent downward to be inserted into the elongate hole of the printed circuit board, which allows the flexible printed circuit board to be easily positioned against the printed circuit board easily. It is also possible to connect the boards smoothly and rigidly with such a simple structure, and further to reduce the assembling time.

In another preferred embodiment, the leading edge portion of the flexible printed circuit board, which is left between the cut portions, is inserted into the elongate hole and the rectangular holes of the printed circuit board in a curved manner, which allows the leading edge portion to be held and connected rigidly.

In yet another preferred embodiment, the tapered cut portions are provided in the leading edge portion of the flexible printed circuit board, which is left between the cut portions, which allows the leading edge portion left between the cut portions to be inserted into the elongate hole or the elongate hole as well as the rectangular holes of the printed circuit board smoothly.

DESCRIPTION OF THE PREFERRED EMBODIMENTS

Embodiments of connecting structures of flexible printed circuit board to printed circuit board according to the present invention will hereinafter be described with reference to the accompanying drawings.

Figure 1A:
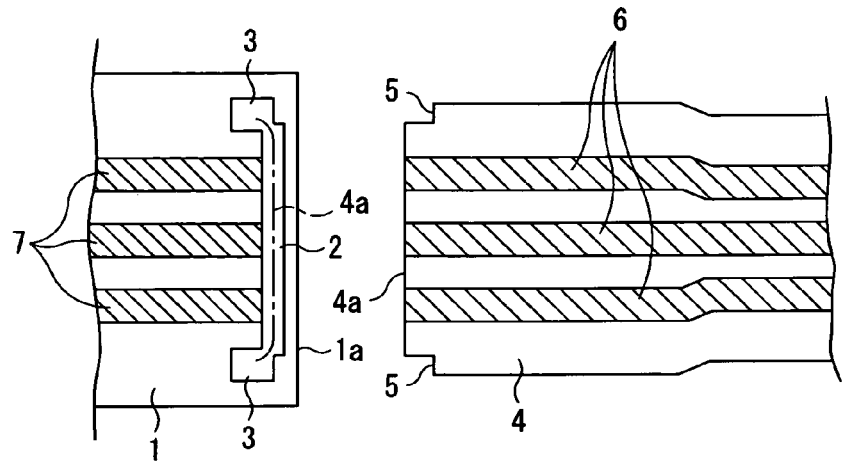
FIGS. 1(a), 1(b) and 1 (c) show a connecting structure connecting a flexible printed circuit board to another printed circuit board according to a first embodiment, wherein FIG. 1 (a) is a plan view showing the state before the flexible printed circuit board is connected to the printed circuit board, FIG. 1 (b) is a plan view showing the state where the flexible printed circuit board is connected to the printed circuit board, and FIG. 1 (c) is a vertical cross-sectional view of the state shown in FIG. 1 (b)
Figure 1B:
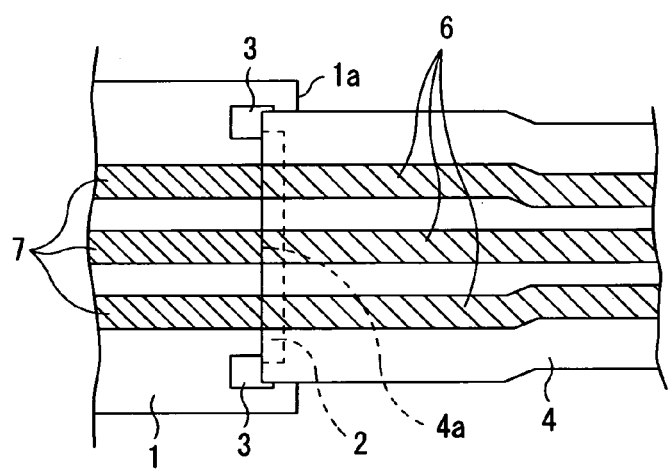
Figure 1C:
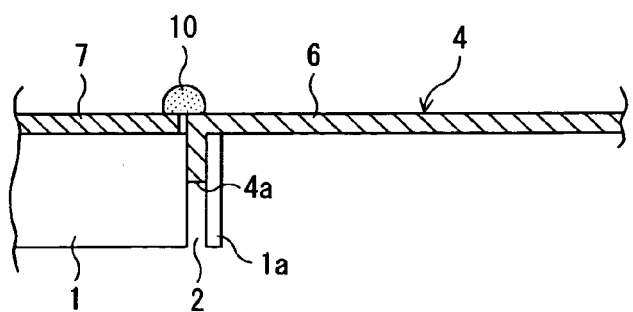

In the connecting structure for connecting a flexible printed circuit board to another printed circuit board according to the first embodiment, as shown in FIG. 1 (a), an elongate hole 2 is formed in the vicinity of and along an edge portion 1a in a connecting part of a printed circuit board 1, and two rectangular holes 3 communicating with the elongate hole 2 are formed at both longitudinal ends of the elongate hole 2, while two cut-outs (notches) 5 for controlling insertion depth are provided at both corners of the connecting edge of the flexible printed circuit board 4.

As shown in FIGS. 1 (b) and 1 (c), the leading edge portion 4a of the flexible printed circuit board 4, which is left between the notches 5, is bent downward, and the bent portion is inserted into the elongate hole 2 and the rectangular holes 3 of the printed circuit board 1 to position the flexible printed circuit board 4, and then patterns 6 on the flexible printed circuit board 4 and patterns 7 on the printed circuit board 1, which face each other, are connected by soldering 10. It is preferred that the width of the elongate hole 2 in the printed circuit board 1 be approximately the same as the thickness of the flexible printed circuit board 4.

In accordance with the first embodiment, the leading edge portion 4a of the flexible printed circuit board 4, which is left between the notches 5, is bent downward to be inserted into the elongate hole 2 and the rectangular holes 3 of the printed circuit board 1, which allows the flexible printed circuit board 4 to be positioned against the printed circuit board 1 easily. It is also possible to connect the boards smoothly and rigidly with such a simple structure, and further to reduce the assembling time. In particular, the leading edge portion 4a of the flexible printed circuit board 4, which is left between the notches 5 and which is inserted into the elongate hole 2 and the rectangular holes 3 of the printed circuit board 1, is curved, which allows the leading edge portion 4a to be held and connected rigidly.

Figure 2:
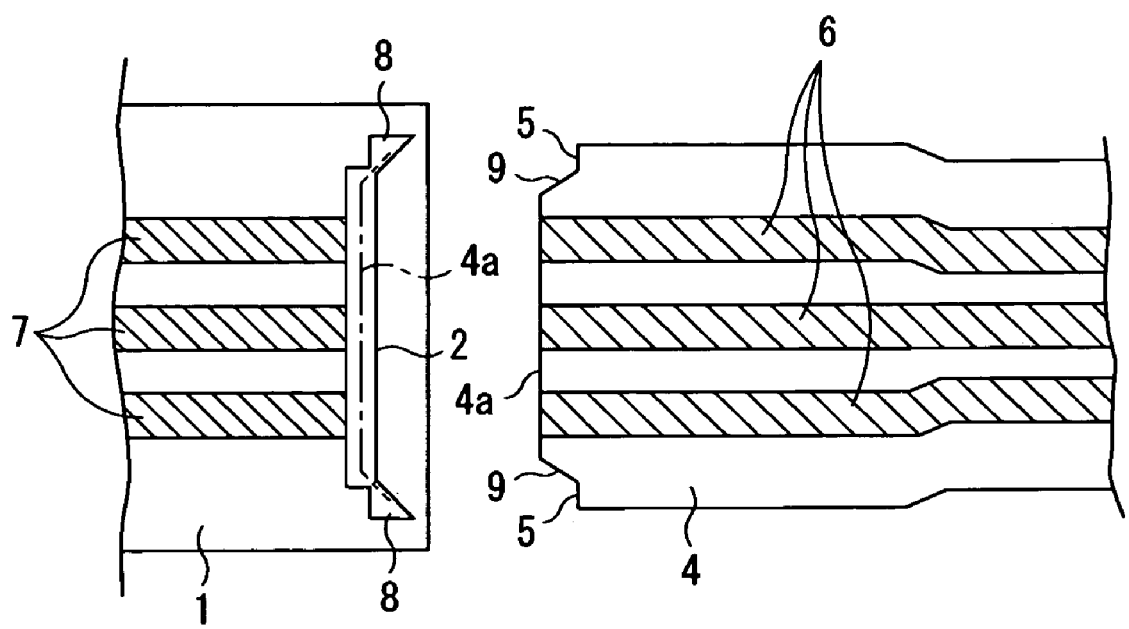
FIG. 2 is a plan view of a connecting structure of a flexible printed circuit board to a printed circuit board according to a second embodiment, showing the state before the flexible printed circuit board is connected to the printed circuit board.
Figure 3A:
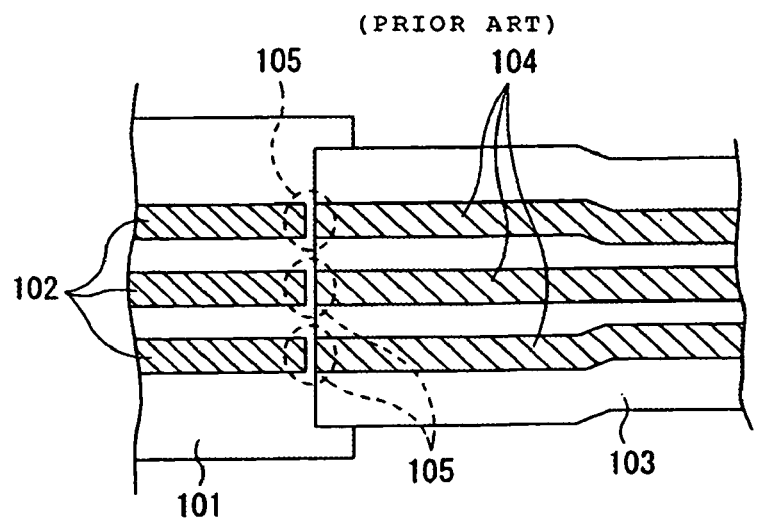
FIGS. 3(a) and 3(b) show a conventional connecting structure of a flexible printed circuit board to a printed circuit board, where FIG. 3 (a) is a plan view thereof and FIG. 3 (b) is a vertical cross-sectional view thereof.
Figure 3B:
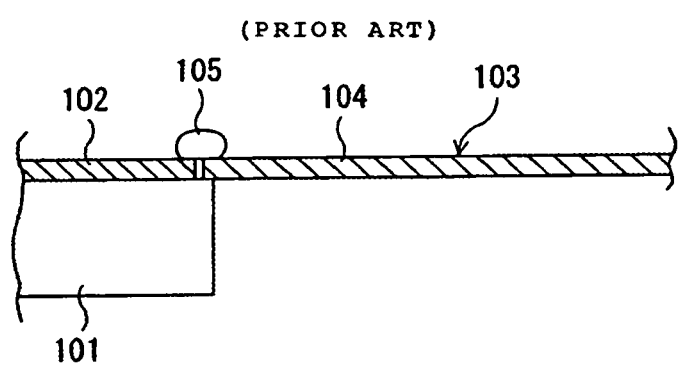
Figure 4:
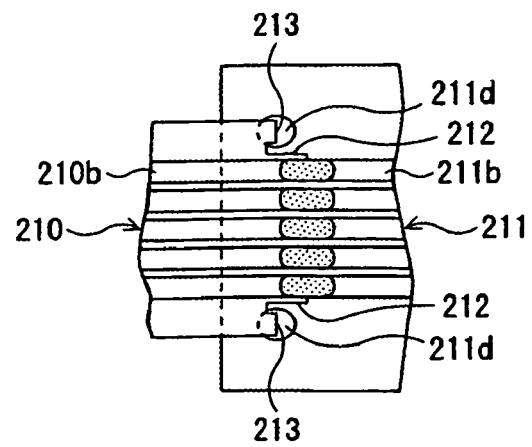
FIG. 4 is a plan view of a conventional connecting apparatus for flexible printed circuit boards.
Figure 5A:
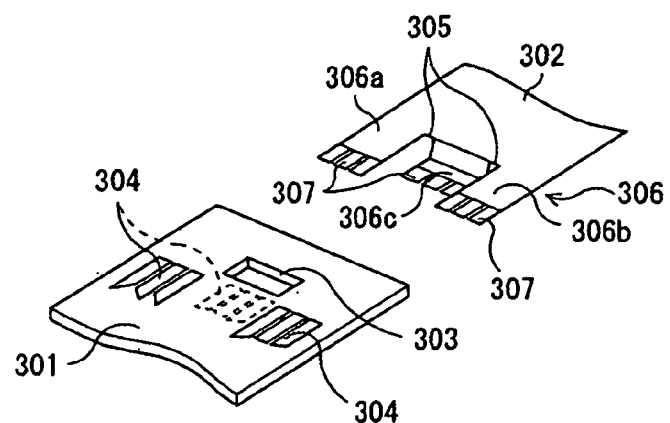
FIGS. 5(a) and 5(b) show a conventional connecting structure for conductive members, where FIG. 5 (a) is a perspective view showing the state before the members are connected and FIG. 5 (b) is a perspective view showing the state where the members have been connected.
Figure 5B:
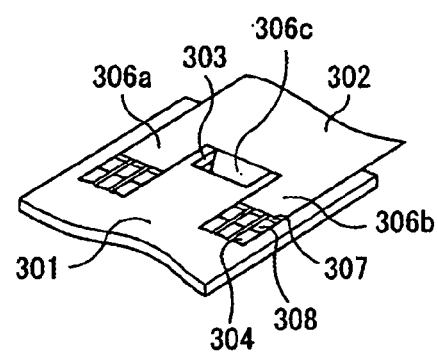
Figure 6A:
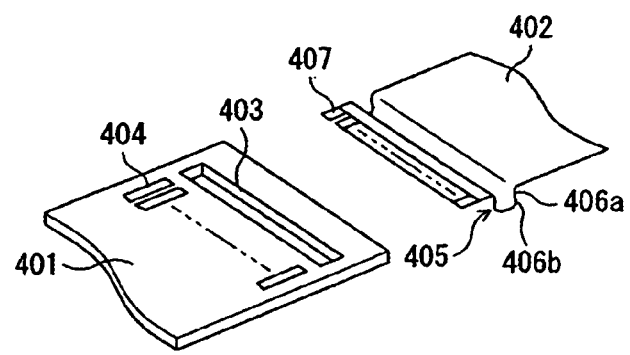
FIGS. 6(a) and 6(b) show another conventional connecting structure for conductive members, where FIG. 6 (a) is a perspective view showing the state before the members are connected and FIG. 6 (b) is a perspective view showing the state where the members have been connected.
Figure 6B:
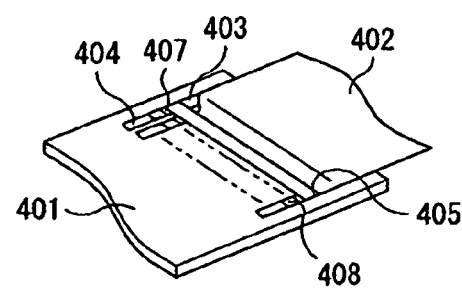

FIG. 2 is a plan view of a connecting structure of a flexible printed circuit board to a printed circuit board according to a second embodiment, showing the state before the flexible printed circuit board is connected to the printed circuit board. It is noted that components and portions identical with those of the foregoing first embodiment are designated with the same numerals.

In the connecting structure of the flexible printed circuit board to the printed circuit board according to the second embodiment, as shown in FIG. 2, two rectangular holes 8 communicating with the elongate hole 2 are formed toward the edge portion 1a in both longitudinal end portions of the elongate hole 2 of the printed circuit board 1. Further, two tapered cut portions 9 which narrow toward the connecting edge are provided on both ends of the leading edge portion 4a of the flexible printed circuit board 4, which is left between the cut portions 5.

The leading edge portion 4a of the flexible printed circuit board 4, which is left between the cut portions 5, is bent downward, and the bent edge portion 4a is inserted into the elongate hole 2 and the rectangular holes 8 of the printed circuit board 1 to connect the patterns 6 on the flexible printed circuit board 4 and the patterns 7 on the printed circuit board 1 by soldering.

Therefore, in accordance with the second embodiment, the leading edge portion 4a of the flexible printed circuit board 4, which is left between the cut portions 5, is inserted into the elongate hole 2 and the rectangular holes 8 of the printed circuit board 1 in a curved manner, which allows the leading edge portion 4a to be held and connected rigidly. Further, the tapered cut portions 9 are provided in the leading edge portion 4a of the flexible printed circuit board 4, which is left between the cut portions 5, which allows the leading edge portion 4a left between the cut portions 5 to be inserted into the elongate hole 2 and the rectangular holes 8 of the printed circuit board 1 smoothly.

It will be appreciated that the foregoing first and second embodiments are not restricted to a structure including the rectangular holes 3 and 8 on both longitudinal ends of the elongate hole 2, but may have only the elongate hole 2, or that the elongate hole 2 may be in communication with holes having another shape such as circular holes at both longitudinal ends.

What is claimed is:

1. A process for connecting a first printed circuit board to a second printed circuit board with a conductive pattern on the first printed circuit board aligned and coplanar with a conductive pattern on the second printed circuit board, the conductive patterns on the first and second circuit boards connected by soldering, wherein:

the first printed circuit board has laterally spaced, opposing side edges and a connecting edge extending between the opposing side edges, an elongate hole is formed in the vicinity of and along an edge portion in a connecting part of the second printed circuit board, and rectangular holes wider than and communicating with said elongate hole are formed at both longitudinal ends of said elongate hole, and cutouts for controlling insertion depth are provided at both ends of the connecting edge of the first printed circuit board, and a leading edge of the first printed circuit board, which extends between and intersects said cutouts and has a length less than the length of the connecting edge, is bent downward to form a bent portion, and said bent portion is inserted into said elongate hole and said rectangular holes of the second printed circuit board to position the first printed circuit board with the conductive patterns on the first and second printed circuit boards, which are aligned and coplanar with each other, connected by soldering.

2. The connecting structure according to claim 1 wherein each cutout is defined by a first edge perpendicular to one of said side edges and a second edge extending perpendicular from said first edge to juncture with said leading edge.

3. The connecting structure according to claim 2 wherein said first printed circuit board is bent in line with the first edges.

4. A connecting structure for connecting a first printed circuit board to a second printed circuit board with a conductive pattern on the first printed circuit board aligned and coplanar with a conductive pattern on the second printed circuit board for soldering together the patterns of the first and second printed circuit boards, wherein:

the first printed circuit board has laterally spaced, opposing side edges and a connecting edge extending between the opposing side edges, an elongate hole is formed in the vicinity of and along an edge portion in a connecting part of the second printed board, and cutouts for controlling insertion depth are provided at both ends of the connecting edge of the first printed circuit board, and a leading edge of the first printed circuit board, which extends between and intersects said cutouts and has a length less tan the length of the connecting edge, is bent downward to form a bent portion, and said bent portion is inserted into said elongate hole of the second printed circuit board to position the first printed circuit board, with the conductive patterns on the first and second printed circuit boards, which are aligned and coplanar with each other, connected by soldering.

5. The connecting structure according to claim 4, wherein triangular holes communicating with said elongate hole are formed at both longitudinal ends of said elongate hole of the second printed circuit board, the leading edge portion of the first printed circuit board, which extends between said cutouts, being inserted inserted into said elongate hole and said triangular holes of the second printed circuit board.

6. The connecting structure according to claim 4 wherein each cutout is defined by a first edge perpendicular to one of said side edges and a second, tapered edge extending from the first edge, away from said one side edge, to juncture with said leading edge.

7. The connecting structure according to claim 5 wherein each cutout is defined by a first edge perpendicular to one of said side edges and a second, tapered edge extending from the first edge, away from said one side edge, to juncture with said leading edge.

8. The connecting structure according to claim 4 wherein each cutout is defined by a first edge perpendicular to one of said side edges and a second edge extending perpendicular from said first edge to juncture with said leading edge.

9. The connecting structure according to claim 8 wherein said first printed circuit board is bent in line with the first edges.

* * * * *

UNITED STATES PATENT AND TRADEMARK OFFICE
CERTIFICATE OF CORRECTION

PATENT NO. : 7,147,480 B2
APPLICATION NO. : 11/113281
DATED : December 12, 2006
INVENTOR(S) : Aiichiro Ikeda It is certified that error appears in the above-identified patent and that said Letters Patent is hereby corrected as shown below:

Column 6, line 3 (claim 2, line 1) "The connecting structure" should read -- The process --.

Column 6, line 7 (claim 3, line 1) (claim 9, line 2) "The connecting structure" should read -- The process --.

Column 6, line 25 (claim 4, line 16) "tan" should read -- than --.

Column 6, line 38 (claim 5, line 6) "Inserted inserted" should read -- inserted --.

Signed and Sealed this

Second Day of October, 2007

JON W. DUDAS
*Director of the United States Patent and Trademark Office*